United States Patent
Kawai et al.

(10) Patent No.: US 6,523,734 B1
(45) Date of Patent: Feb. 25, 2003

(54) METHOD FOR JOINING WIRING BOARDS AND MANUFACTURING DATA CARRIER AND DEVICE FOR MOUNTING ELECTRONIC COMPONENT MODULES

(75) Inventors: Wakahiro Kawai, Kyoto (JP); Masanobu Okada, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/591,346

(22) Filed: Jun. 9, 2000

(30) Foreign Application Priority Data

Jun. 22, 1999 (JP) .......................... 11-176022

(51) Int. Cl.[7] ............................................. B23K 20/10
(52) U.S. Cl. ................................. 228/110.1; 156/73.1
(58) Field of Search .......................... 228/110.1, 1.1, 228/51, 123.1; 156/73.1, 580.2; 29/872, 830, 832

(56) References Cited

U.S. PATENT DOCUMENTS 3,934,783 A * 1/1976 Larrison
5,354,392 A * 10/1994 Santo et al.
6,089,438 A * 7/2000 Suzuki et al.

* cited by examiner

Primary Examiner—Tom Dunn
Assistant Examiner—Jonathan Johnson
(74) Attorney, Agent, or Firm—Dickstein Shapiro Morin & Oshinsky LLP

(57) ABSTRACT

A method for joining a first wiring board covered with a conductive pattern on a surface of a thin resin basic plate to a second wiring board covered with a conductive pattern on a thin resin basic plate to ensure the electric connection therebetween, including the steps of putting said first and second wiring boards together in a confront relationship so as to adjust join predetermined portions on the conductive patterns, catching the join predetermined portions in the status by a pair of ultrasonic welding tools, and applying an ultrasonic vibration to said ultrasonic welding tools to weld the conductive metals located on the join predetermined portions.

3 Claims, 13 Drawing Sheets

METHOD FOR JOINING WIRING BOARDS AND MANUFACTURING DATA CARRIER AND DEVICE FOR MOUNTING ELECTRONIC COMPONENT MODULES

BACKGROUND OF THE INVENTION

1. Field of the Invention

This invention relates to a method for joining wiring boards each having a thin resin base plate suitable for instant connection with a reduced cost, a method for manufacturing a data carrier readable by electromagnetic waves which serves as an aviation tag, a label for transportation management, a non-clerk attendant gate pass, and a device for mounting an electronic module on a body of the data carrier.

2. Description of the Related Art

According to the progress of an electronics device such as a card type electronic device, a portable telephone or an image device, recently it has become necessary that a printed circuit board, particularly a flexible printed circuit board, may be made at a reduced cost. Accordingly, a joining unified technique in flexible thin printed circuit plates 10 and 20, particularly an electrical connection between conductive patterns 12 and 22 on each wiring plate, as shown in FIGS. 12 and 13 is required to be performed at a reduced cost.

Several conventional methods have been introduced for joining printed circuit boards 10 and 20 providing conductive patterns 12 and 22 formed respectively over one surfaces of insulating base members 14 and 24.

According to a first conventional method, printed circuit boards 10 and 20 are joined each other by bonds such as epoxy bonding material, through-holes are made penetrating joining points 13 and 23 which are join predetermined portions, and insides of the through holes are electrically connected by metal conductive plating (such as a copper Cu) formed thereon, whereby multiple layer printed circuit boards are produced.

According to a second conventional method, at least one of the connection points 13 and 23 on the printed circuit boards 10 and 20 is applied by screen print with conductive bonds spread by conductive powder such as silver Ag into thermosetting property bonds, the connection points 13 and 23 are confronted each other and put together to be joined by heat-treatment with a proper pressure. Joining at a connection point 30 is performed by the above-mentioned conductive bond, but portions other than the connection point are connected by insulating bonds such as epoxy bonds, whereby the mechanical strength is increased.

According to a third method which is proposed in view of deletion of the process of the application of electrical conductive bonds and thermosetting property in the above-mentioned second method or reduction of cost by reducing the processing time, a previously formed connection sheet is inserted between connection points 13 and 23 of the printed circuit boards 10 and 20 to be heat pressure welded for connecting the connection points 13 and 23. The connection sheet is provided with a circuit formed by conductive paint and thermoplasticity bond paint thereon applied on polyester film (PET), and inserted between the connection points 13 and 23 to be heat-pressure welded, whereby the thermoplasticity bond is melted and the connection point 13 subsequently comes into contact with a conductive paint circuit and the connection point 23, so that the thermoplasticity bond is hardened by cooling the same to complete the connection process. In this method, the process of application by the conductive bond to the printed circuit boards 10 and 20 is unnecessary, and the connection time may be reduced by employing the thermoplasticity bond.

These conventional methods, however, have several disadvantages. In the first and second conventional methods, there are many processes of bonding-material application, plating, and heat treatment which need other connection member such as bonding material, plating metal, and electroconductivity bonding-material, resulting into cost increase. The connection process becomes very difficult after the electronic components 11 and 21 are mounted on the printed circuit boards 10 and 20.

The third method may ease the process after mounting the electronic parts resulting into reduction of the process time, but the manufacturing cost may not be preferably reduced because of the necessity of other member such as the connection sheet.

SUMMARY OF THE INVENTION

It is, therefore, a primary object of this invention to provide an improved method for joining wiring boards each other, which may be performed by a reduced cost and applied to the boards assembled by electronic components, and the processing time which may be reduced.

According to a first aspect of this invention, there is provided a method for joining a first wiring board covered with a conductive pattern on a surface of a thin resin basic plate to a second wiring board covered with a conductive pattern on a thin resin basic plate to ensure the electric connection therebetween, including the steps of putting the first and second wiring boards together in a confront relationship so as to adjust join predetermined portions on the conductive patterns, catching the join predetermined portions in the status by a pair of ultrasonic welding tools, and applying an ultrasonic vibration to the ultrasonic welding tools to weld the conductive metals located on the join predetermined portions.

According to this method, any separate member such as glues is not necessary for connection and processing time is extremely short, thereby reducing the joining work cost and the device cost. Moreover, the application area is limited to a peripheral of the connection points, thereby simplifying a connection process of the printed wiring boards after assembled by electronic components. The connection process is free from wetness with separate glue member, incomplete connection, thereby enabling connection between conductors of different metals such as copper (Cu) and aluminum (Al).

According to a second aspect of this invention, there is provided a method as set forth in the first aspect of this invention for joining the wiring boards, in which a plurality of projections each having an end face shape corresponding to a desired welding portion shape are disposed on at least one of opposite end faces of the pair of ultrasonic welding tools, further including the steps of partially removing a conductive metal due to plasticity flow of the metal when an ultrasonic vibration is applied by the projections, and welding plastics exposed by the removed portion.

According to this method, after metal conductors of a printed wiring board composed of insulating resins and the metal conductors are welded by ultrasonic vibrations, the conductive metal is partially removed by employing plasticity flow of metal by the ultrasonic vibrations, and the exposed plastic members are welded. Accordingly, the electrical connection between conductive patterns is executed by metal welding, and the mechanical strength of the connection is sufficiently ensured by plastic members and welding. The above-described effects of the ultrasonic may be found in the connection between metal foils.

According to a third aspect of this invention, there is provided a method for manufacturing a film-type data carrier by joining an electronic component module in which a conductive pattern is adhered on a surface of a film-type resin small piece and electronic components, providing a transmission and reception circuit, and a memory mounted thereon, to a data carrier body having a spiral conductive pattern providing an antenna adhered on a surface of a film-type resin base plate, to be unified to ensure an electrical conduction for reading electromagnetic waves, including the steps of putting the film-type resin base plate of the data carrier body and the film-type resin small piece of the electronic component module together in a face-to-face relationship to adjust join predetermined portions on the conductive patterns, catching the adjusted join predetermined portions by a pair of ultrasonic welding tools, and applying an ultrasonic vibration to the ultrasonic welding tools to weld the conductive metals located on the join predetermined portions.

According to this method, any member such as conductive glue materials is unnecessary for electrical connection between terminals, resulting into an assembly work at a reduced cost. Moreover, enlargement of connection area by ultrasonic welding may provide sufficient mechanical connection strength to fix the electronic component module. Different kinds of metals may be joined, such as an aluminum pattern on the module and a copper pattern on the data carrier body. Wide selection is also available as to the materials of the antenna coil or the mounting method of the electronic components. The joining time by ultrasonic waves is short such as two or three seconds, and supply of such a component as glue is not necessary, thereby resulting into simplification of the manufacturing apparatus.

The ultrasonic wave joining is based on a principle in which a passivity layer on a surface of metals is mechanically removed by vibrations, and an exposed new area is joined. Accordingly, electrical connection between terminals may be made without peeling an insulating etching resist used in an etching method for producing an antenna coil, resulting into reduction of a manufacturing cost caused by peeling of the etching resist, and deletion of an additional process for covering pattern surfaces with an insulating layer.

According to a fourth aspect of this invention, there is provided a method as set forth in the third aspect of this invention for manufacturing a data carrier in which a plurality of projections each having end face shape corresponding to a desired welding portion shape are disposed on at least one of opposite end faces of the ultrasonic welding tool, and welding plastics exposed by the removed portion.

This method enhances the joining strength of the electronic component module against the data carrier body is enhanced, and improves the reliability of the data carrier against rough handling applied to labels for management of material distribution or aviation tags.

According to a fifth aspect of this invention, there is provided an electronic component module mounting device for mounting an electronic component module on a data carrier body in a manufacturing process for an electromagnetic wave readable film-type data carrier, including a punch work die having a mold configuration corresponding to the electronic component module, a punch to be inserted into the punch work die, a support table disposed opposing to a punching forward direction of the die to push the data carrier body backward, and an ultrasonic horn applying ultrasonic wave vibrations to the punch, in which the electronic component module is punched out from an electronic component mounting film base by the die and the punch, the punched out electronic component module is pushed to the data carrier body in proportion to the forward movement of the punch to be welded on the data carrier body by applying ultrasonic wave vibrations to the punch by driving the ultrasonic horn. Thus, an ultrasonic wave junction technique may be introduced into a continuous manufacturing process for the data carrier.

BRIEF DESCRIPTION OF THE DRAWINGS

Other objectives and advantages of this invention will be more readily apparent from the following detailed description provided in conjunction with the following figures, of which.

DETAILED DESCRIPTION OF THE PREFERRED EMBODIMENTS

Figure 1:
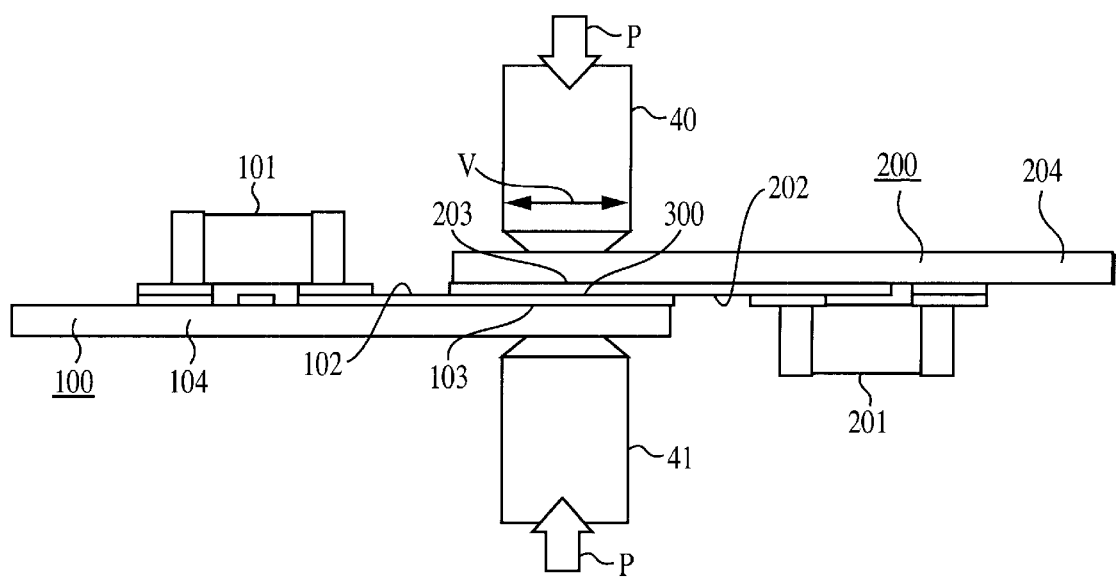
FIG. 1 is a side view of joined wiring boards for explaining an ultrasonic joining method according to a first embodiment of this invention.

Referring, now, to FIG. 1, there is shown an ultrasonic joining method as a first embodiment of this invention by employing a first wiring board 100, a second wiring board 200, electronic components 101 and 201, a conductive pattern 102 formed by etching a copper foil having a thickness of 9 micrometers, a conductive pattern 202 formed by etching an aluminum foil having a thickness of 20 micrometers, a join predetermined join position (connection point) 103 on the conductive pattern 102, a join predetermined portion (connection point) 203 on the conductive pattern 203, and films 104 and 204 having a thickness of 25 micrometers made of PET (Polyethylene terephthalate).

This joining method for wiring boards employs an ultrasonic joining technique. After the connection points 103 and 203 for electrical connection are put together in a face-to-face relationship, they are caught by an ultrasonic horn 40 and an anvil 41 to apply a pressure load P and an ultrasonic wave vibration V to a contact interface 300 of the contacts.

Generally, welding is performed by bringing atoms into a distance (several angstroms) in which atoms on a surface of a metal to be joined together are mutually applied by attractive forces and by contacting atoms over a surface taking alignment in order. A surface of a metal is generally covered with a thin surface layer of oxidate and adsorption gas, whereby approach by metal atoms on its sub stratum is prevented and sufficient joining force cannot be obtained.

According to this ultrasonic wave joining method, a metal surface layer is removed by the ultrasonic vibration V by the above-mentioned method, an atom vibration is accelerated by the pressure load P to disperse atoms near the contact interface 300, thereby completing electrical connection between the conductive patterns 103 and 203.

This ultrasonic wave joining method does not require any separate members such as glue, requires only short work treatment time such as 0.5 second resulting into great cost reduction of connection work, and works only connection points resulting into easy connection work even after mounting the electronic components.

Figure 2A:
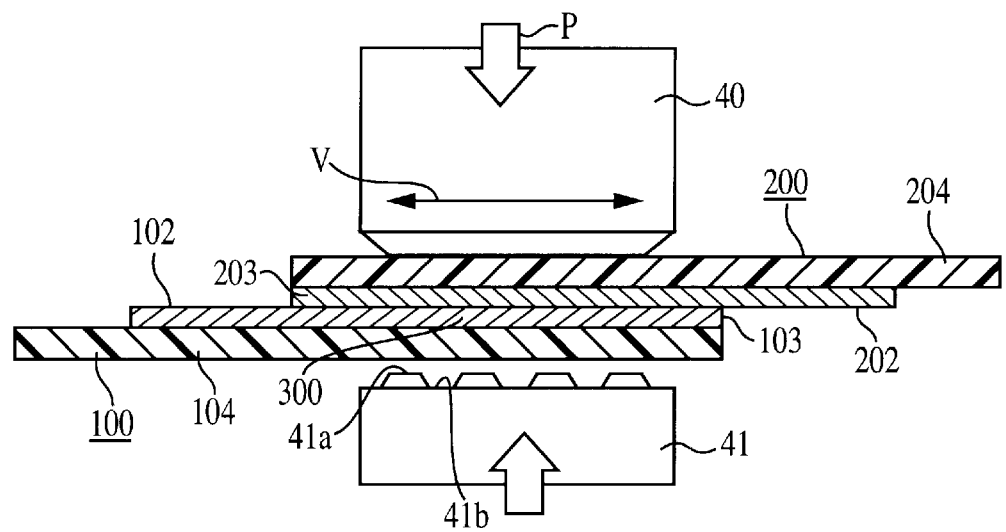
FIG. 2 is a side sectional view of joined wiring boards for explaining a method according to a second embodiment of this invention.
Figure 2B:
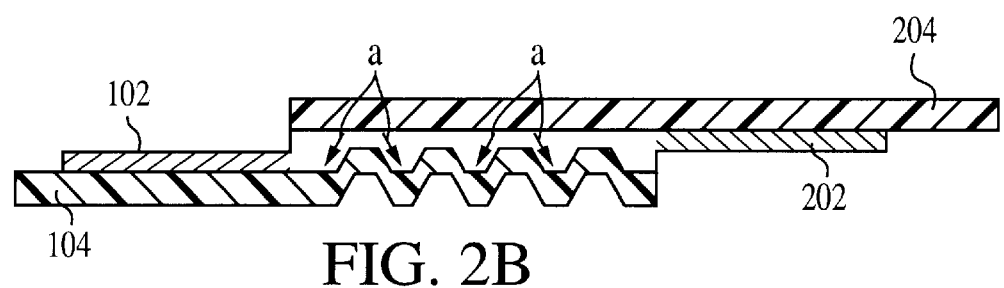
Figure 2C:
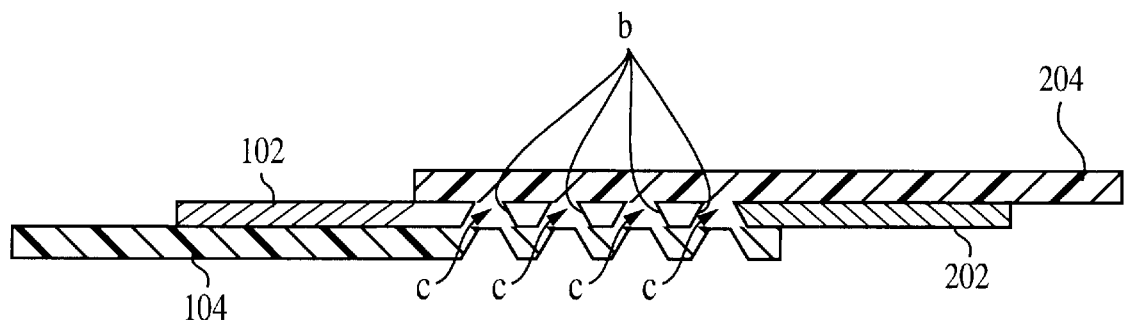
Figure 3:
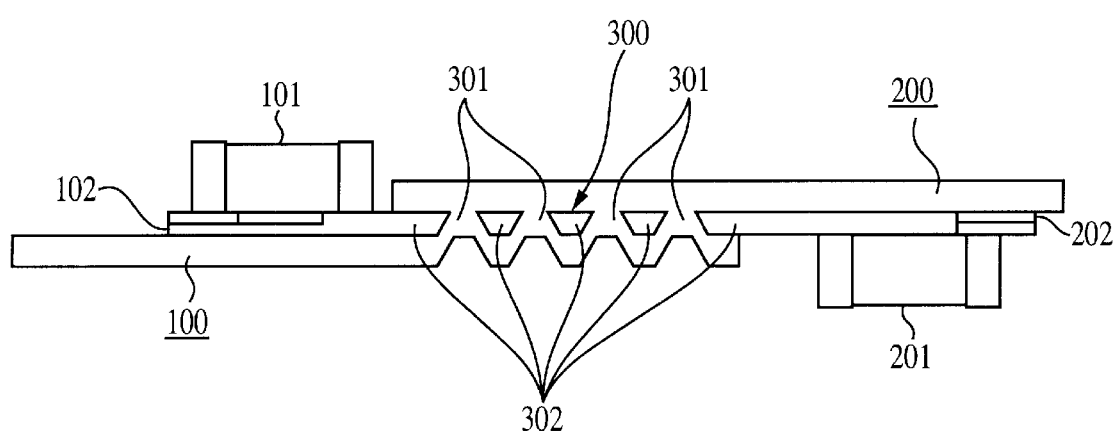
FIG. 3 is a sectional view of a joined construction according to the second embodiment.
Figure 4:
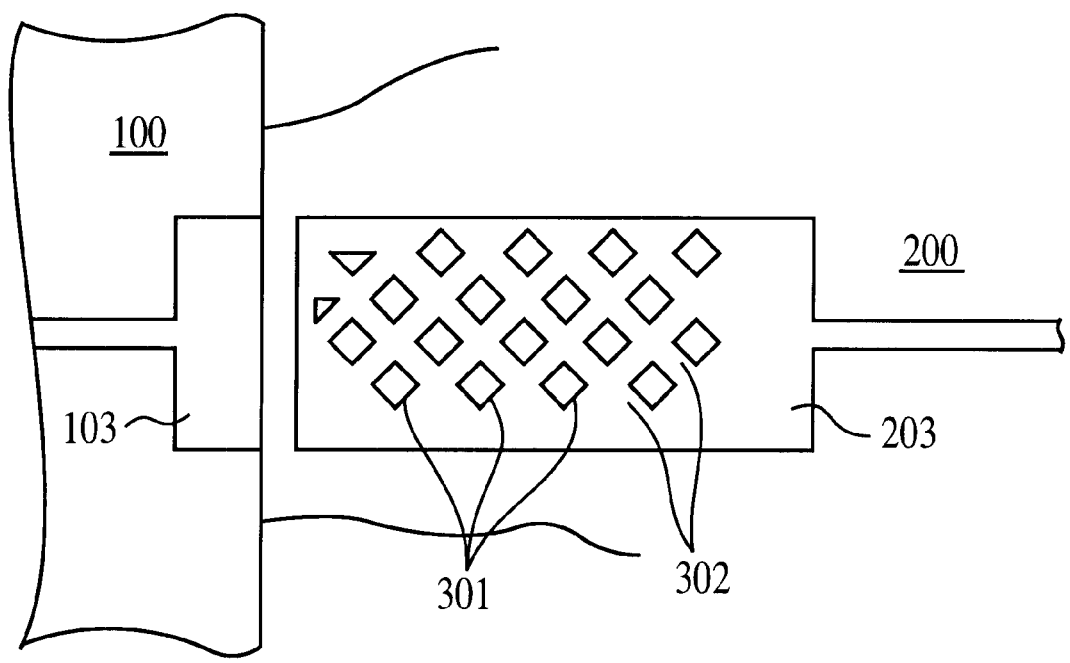
FIG. 4 is a top view of a joined construction according to the second embodiment.

In FIGS. 2 to 4, there is shown a second embodiment of this invention. The same components as those of the first embodiment are given by the same reference numerals. In a joining method of wiring boards in this embodiment, a bonding strength by welding of conductive metals is strengthened by the welding strength between board resins. In the fist embodiment, the conductive patterns 102 and 202 commonly employ metal conductor of copper or aluminum of 10 to 36 micrometers in thickness, whereby sufficient mechanical strength cannot be expected in the welding between these metal foils. This disadvantage may be overcome by this second embodiment.

As shown in FIG. 2 at (A), join predetermined portions 103 and 203 of conductive patterns 101 and 201 on printed wiring boards 100 and 200 are arranged in a opposite relationship, and brought into contact at a contact interface 300. Next, an ultrasonic horn 40 and an ultrasonic wave anvil 41 are disposed to catch the contact interface 300, and the contact interface 300 is applied by a load pressure P 0.2 Kg/mm$^8$ and an ultrasonic wave vibration V at 40 KHz for 0.5 second. A plurality of projections 41a are disposed on a confronting end face of at least one (the anvil 41 in this embodiment) of a pair of ultrasonic wave welding tools, viz., the ultrasonic horn 40 and the ultrasonic anvil 41. The configuration of the end face of the projection 41a corresponds to a desired welding configuration. In the time period 0.5 second, the construction of the connection points of this invention is made, and its producing process will be subsequently explained in FIG. 2 at (B) and (C).

As shown in FIG. 2 at (B), upon applying the ultrasonic wave vibration V into the contact interface 300 of metals, the weld joining is performed between conductive metals 102 and 202 according to the above-described ultrasonic joining principle. As the vibration is further applied, metal plasticity flow happens as shown in arrow marks "a", the metal moving from a position corresponding to the convex 41a of the anvil 41 to a position corresponding to the concave 41b. As a result, the conductive patterns 102 and 202 are bored by openings "b" at a position corresponding to the projections 41a of the anvil 41, and the resin base plates 104 and 204 are brought into contact through the opening "b".

As shown in FIG. 2 at (C), further welding bond between resin members are accelerated by further ultrasonic wave vibrations at connection points "c" where the resin (PET) substrates 104 and 204 contact each other through the openings "b" made by metal plasticity flow.

Thus, the ultrasonic wave join construction according to this invention is completed, and the completed join construction is shown in FIGS. 3 and 4. The weld portion 301 of resin members having a strong mechanical joining strength and metal join portion 302 having electrical conductivity simultaneously exist on the contact portion 300 between the connection ends 103 and 203, thereby providing high joining strength and high electrical connection.

Though the resin member of the printed wiring boards of this embodiment employs PET, it may employ polyimide, ethylene resin naphtha rate (PEN) or the like, if desired. FIG. 4 exemplarily shows a welding trace of a mesh form at the connection portion in this embodiment. The trace may be chosen from other various designs by changing the convex and concave configurations formed on the surfaces of the ultrasonic horn 40 or the anvil 41.

Referring to FIGS. 5 to 9, there is shown a method for manufacturing an electromagnetic wave readable data carrier as a third embodiment of this invention, which is suitable for aviation tags, management labels of material distribution, passes for no-clerk attendance examination of tickets and so forth.

There may be proposed an electromagnetic wave readable data carrier including a data carrier body in which a spiral conductive pattern providing an antenna coil is coated on a surface of a film-type resin base plate, and an electronic component module mounted by electronic components providing a transmission-and-receipt circuit and a memory which is put on the data carrier, both of which are joined together into a single unit to ensure electrical conduction. The electric connection between the join predetermined portion of the conductive pattern of the data carrier body and the join predetermined portion of the conductive pattern of the electronic component module is executed by employing an electric conductive bond such as an anisotropy electrically conductive film or soldering. This method has the disadvantages that it needs a bond member such as an electrically conductive bond at an increased material cost, and a manufacturing device is complicated because of the necessity of a process for heating and a supply of the joining member. This embodiment, however, allows the electronic component module to be quickly mounted on the data carrier body at a reduced cost.

Figure 5:
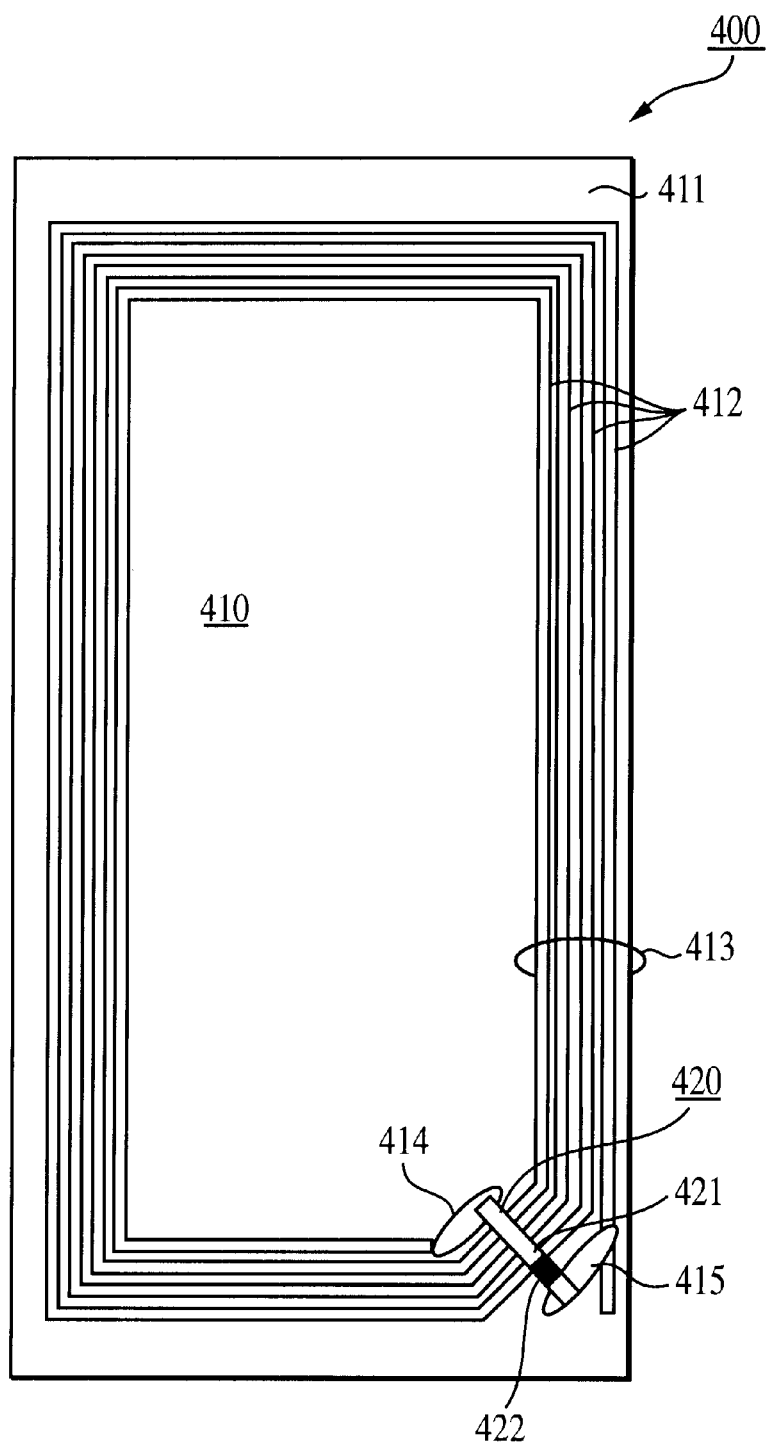
FIG. 5 is a top view of a data carrier as a third embodiment of this invention.
Figure 6:
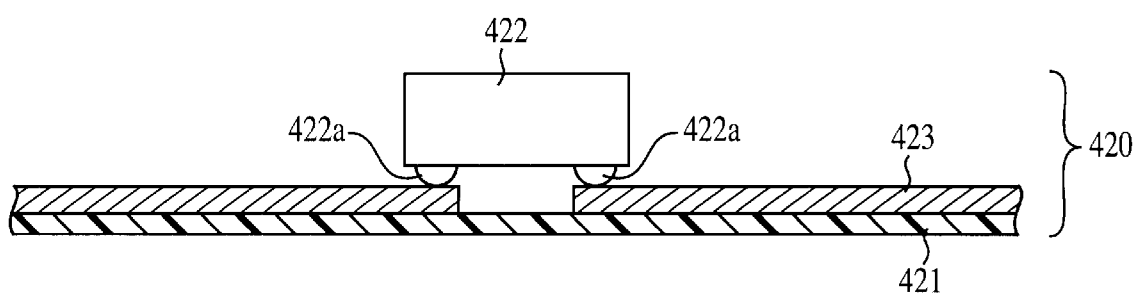
FIG. 6 is a sectional view of an electronic component module employed in the third embodiment.

FIG. 5 shows a top view of a whole construction of a data carrier 400, and FIG. 6 shows an enlarged sectional view of one example of construction of an electronic component module 420 including a gold bump 422a and an aluminum conductive pattern 423. The data carrier 400 includes a data carrier body 410 in which a copper foil spiral conductive pattern 412 (serving as an antenna) having a thickness of 10 micrometers held on one wall of PET (ethylene resin naphtha rate) board 411 having a thickness of 25 micrometers, and the electronic component module 420 in which a PET film small piece 421 having a thickness of 25 micrometers including an aluminum wiring conductive pattern 423 on a surface thereof is mounted by an electronic component, pair chip IC 422. In the electronic component module 420, the small piece 421 is mounted on the data carrier body 410 across (or cross) a bundle of peripheral conductors 413 providing the spiral conductive pattern 412, the electric connection with the spiral conductive pattern 412 is made at an internal circumference terminal pad 414 and an outer circumference terminal pad 415.

The manufacturing method for the data carrier body 410 and the electronic component module 420 shown in FIGS. 5 and 6 will be described in detail hereinafter.

Figure 7A:
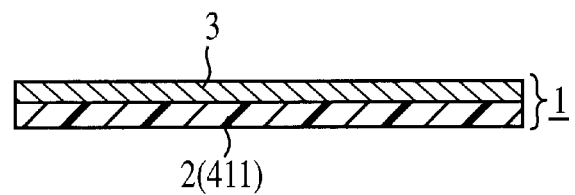
FIG. 7 shows a manufacturing process for the data carrier body employed in the third embodiment.
Figure 7B:
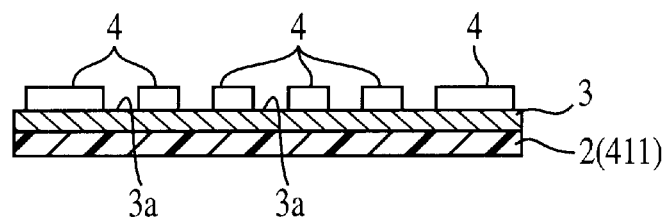
Figure 7C:
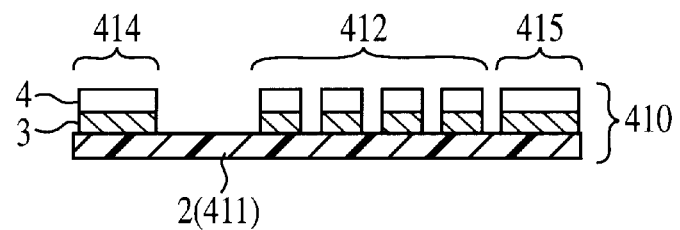
Figure 8A:
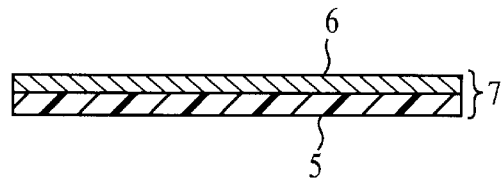
FIG. 8 shows a manufacturing process for the electronic component module employed in the third embodiment.
Figure 8B:
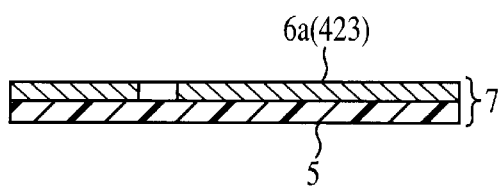
Figure 8C:
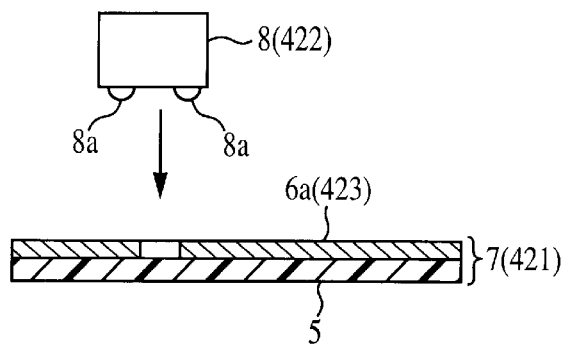
Figure 8D:
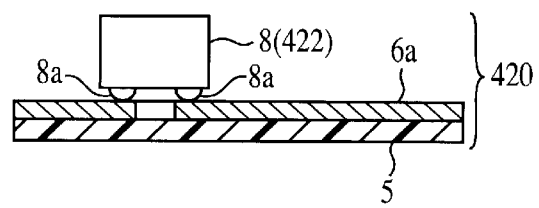

FIG. 7 shows one example of a process for making the spiral conductive pattern providing the antenna. The process for forming the spiral conductive pattern 412 serving as an antenna coil on one face of the PET film base 411 will be described below.

(Process A)

First, Cu-PET laminating base member 1 should be prepared. For instance, a copper foil of 10 micrometers in thickness is put on one face of a PET film of 25 micrometers in thickness through a carbamic acid ester series glue to be laminated by heat laminate under the conditions of 150 degree C. and pressure 5 Kg/cm$^2$. Thus, the Cu-PET laminating member 1 is completed by the copper foil 3 coated on the surface of the PET film 2 (411).

(Process B)

Next, an etching resist pattern 4 including a spiral shape and a terminal shape is formed on a surface of the copper foil 3 of the Cu-PET laminating member 1. Namely, insulating etching resist ink is printed on the copper foil by offset printing in a spiral shape having a turn number, a lead width, a pitch and inner and outer circumferences to provide an L value and a Q value which are necessary for characteristics of the coil. The resist ink is employed to be hardened by heat or activation energy rays. The activation energy rays employ an ultra-violet ray or electron beam. When the ultra-violet ray is employed, the resist ink is used by putting photo polymerization materials therein.

(Process C)

A Cu foil portion 3a exposed is removed from the etching resist pattern formed in the above-mentioned process by a conventional etching method to form the spiral conductive pattern 412 serving as an antenna coil and the terminal pads 414 and 415 of the inner and outer circumferences. In this etching process, FeCl$_2$ (120 g/l) under the condition of 50 degree C. is used as the etch liquid to remove an unnecessary copper foil portion.

According to a conventional process, any electronic component, viz. coil, may not be mounted on any circuit without removing the insulating etching resist 4 formed in the above-mentioned process (B). In this embodiment, however, the etching resist located at the join predetermined portion is removed by mechanical friction caused by ultrasonic waves, so that any step for peeling the insulating resist 4 is not necessary. Thus, according to this embodiment, any peeling process of the etching resist 4 may be omitted, and the etching resist 4 may be used for an insulating cover layer for the copper conductive pattern surface.

Next, a process for producing an electronic component module will be described hereinafter referring to FIG. 8.

(Process A)

First, Al-PET laminating member 7 where an aluminum foil 6 of 20 micrometers in thickness bonded on a PET film 5 of 25 micrometers in thickness should be prepared.

(Process B)

Next, the aluminum foil 6 on the laminating member 7 is worked into a predetermined circuit pattern to form a conductive pattern 6a (423). The working method may employ a conventional etching method, or a press working at reduced cost if the circuit pattern is simple.

(Process C)

An electronic component 8 (422) is mounted on a conductive pattern 6a formed on the PET film 5 to complete an electronic component module 420. The electronic component 8 is constructed to have gold bumps 8a from a bottom wall thereof for connection as a surface mount type component. The gold bumps 8a projecting from the bottom wall are loaded by ultrasonic wave vibrations to mechanically remove the oxidate layer on a surface of the aluminum conductive pattern 6a, and further by heat caused by frictional heat to disperse gold atoms within the aluminum for junction. After arranging pair chip IC representing the electronic component 8, this mounting method is executed by applying an ultrasonic wave vibration of 40 KHz for several seconds under load pressure 0.2 Kg/mm$^8$ (Process D). The base member in this embodiment employs an ethylene resin naphtha rate (PET) film, but may employ a polyimide film or the like, if desired.

Figure 9A:
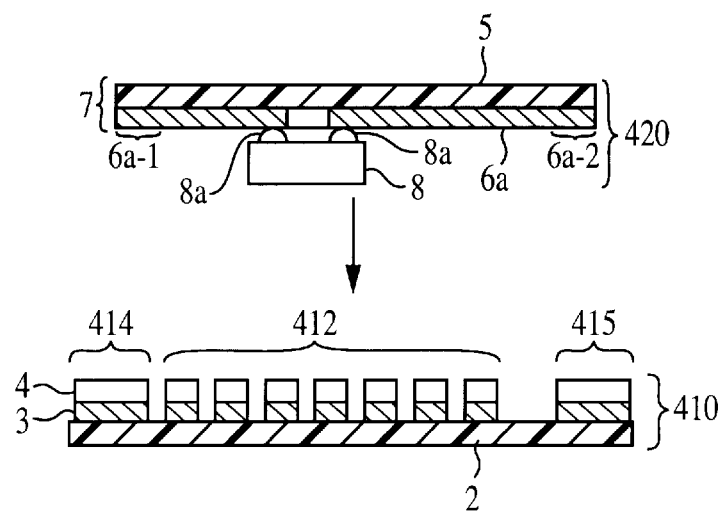
FIG. 9 shows an ultrasonic wave joining process employed in the third embodiment.
Figure 9B:
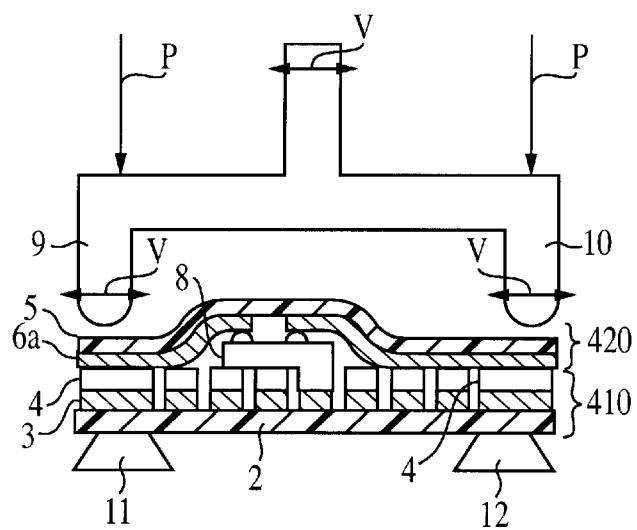

In FIG. 9, there will be explained a process for mounting the electronic component module 420 on the data carrier 410 to be electrically connected with the antenna coil. This process employs an ultrasonic wave welding technology.

(Process A)

First, the electronic component module 420 is mounted on the data carrier body 410 in an alignment condition such that join predetermined portions 6a-1 and 6a-2 of the electronic component module confront the terminal pads 414 and 415 serving as join predetermined portions.

(Process B)

A pair of penetrators 9 and 10 descending as a single unit press top portions of the join predetermined portions 6a-1 and 6a-2 by applying a load pressure P (0.2 Kg/mm$^3$) and an ultrasonic wave vibration of the vibration V (40 KHz) for the time T (0.5 second). Anvils 11 and 12 are arranged to opposite to the penetrators 9 and 10.

Generally, welding is performed by approaching atoms into a distance (several angstroms) where attractive forces work in mutual atoms on surfaces of metals to be joined and arranging atoms over the surface in order to be contacted. Generally, the surface of metals are covered with a thin layer of oxidate and adsorption gas, whereby clean metal atoms on the lower layer are prevented from approaching and sufficient joining force is not produced.

In this ultrasonic joining method of this embodiment, the metal surface layer is removed by ultrasonic wave vibration in the above-described manner, and the atoms are dispersed by accelerating atom vibrations to bond the terminal of the electronic component module with the terminal of the antenna coil to be fixed.

This method is also based on the principle for removing a surface layer of metal by ultrasonic wave vibrations to be joined. Even if this joining process is executed without peeling the insulating etching resist 4 formed on the terminal pads 414 and 415 of the conductive pattern in the process (B) of FIG. 7, sufficient electric and mechanical join characteristics are obtained between the eletcronic component module 420 and the data carrier body 410. Thus, the film-type data carrier 400 (see FIG. 5) according to this invention is completed.

Alternatively, the resin welding technique described in the second embodiment may be applied to the third embodiment. For instance, a plurality of concave and convex portions corresponding to the configurations of welding portions are disposed on end faces of the anvils 11 and 12 opposing to the penetrators 9 and 10, and metal plasticity flow is locally produced corresponding to the projections to weld resins exposed in the portions from which the metal layer is removed by ultrasonic wave vibrations. In this modified method employing the metal welding and the resin welding, the mechanical joining strength of the electronic component module is extremely improved, and useful when the data carrier is roughly handled as an aviation tag or a management label for materials.

Figure 11:
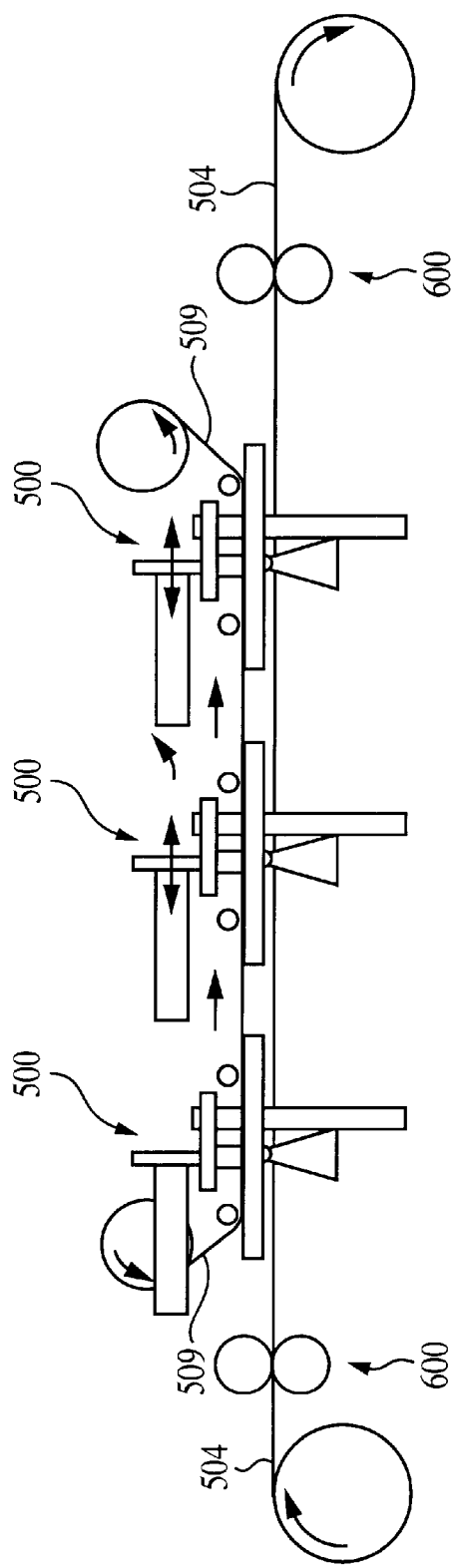
FIG. 11 is a view of a manufacturing line to include the mounting device of this invention.
Figure 12:
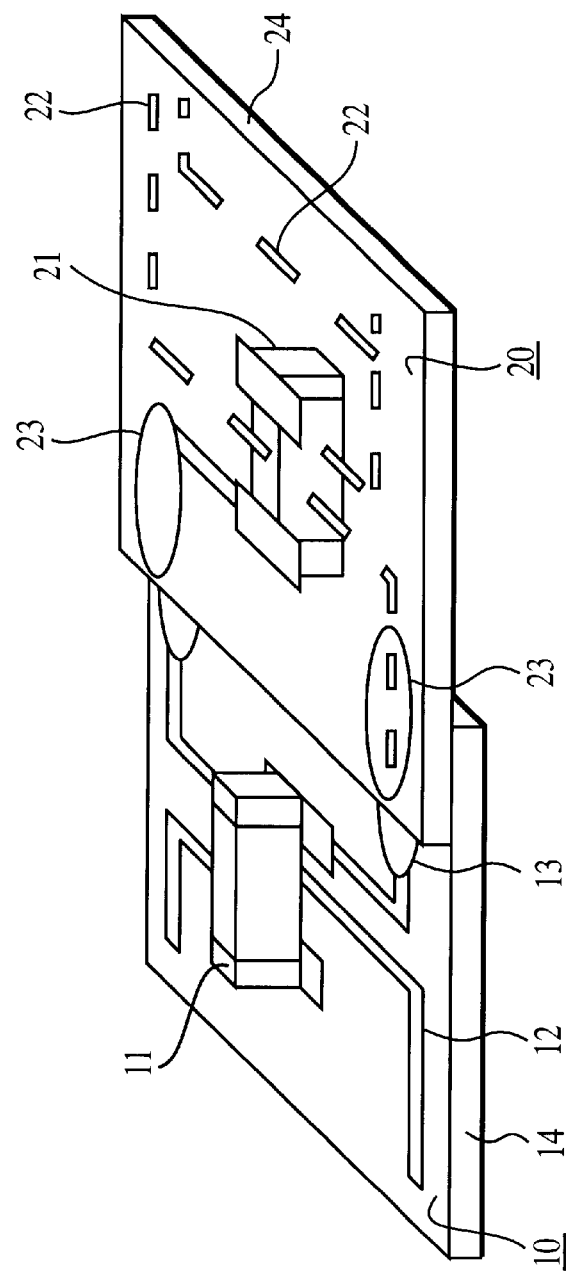
FIG. 12 is a slant view of joined boards according to a conventional technique.
Figure 13:
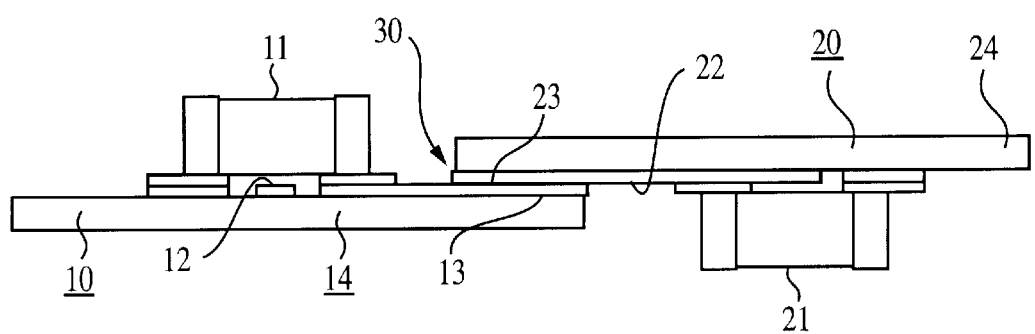
FIG. 13 is a sectional view of joined boards according to a conventional technique.

In FIG. 11, there is shown a whole image of a manufacturing line including mounting devices 500 for mounting the electronic component modules on the data carrier main bodies in a manufacturing process for manufacturing electromagnetic wave readable film type data carriers.

As described later, the device 500 is provided with a work die for punching out a configuration corresponding to the electronic component module, a work punch to be inserted into the punching-out work die, a susceptor for putting the data carrier from back side arranged in opposition to forward of a punching direction of the die, and an ultrasonic horn for applying ultrasonic wave vibrations to the punch.

Electronic component modules are punched out by the die and punch from a film base member mounted by electronic components, the punched out electronic component modules are pushed toward the data carrier body together with the forward movement of the punch, and the punch is applied by ultrasonic wave vibrations driven by the ultrasonic horn so that the modules are welded on the data carrier body.

Figure 10:
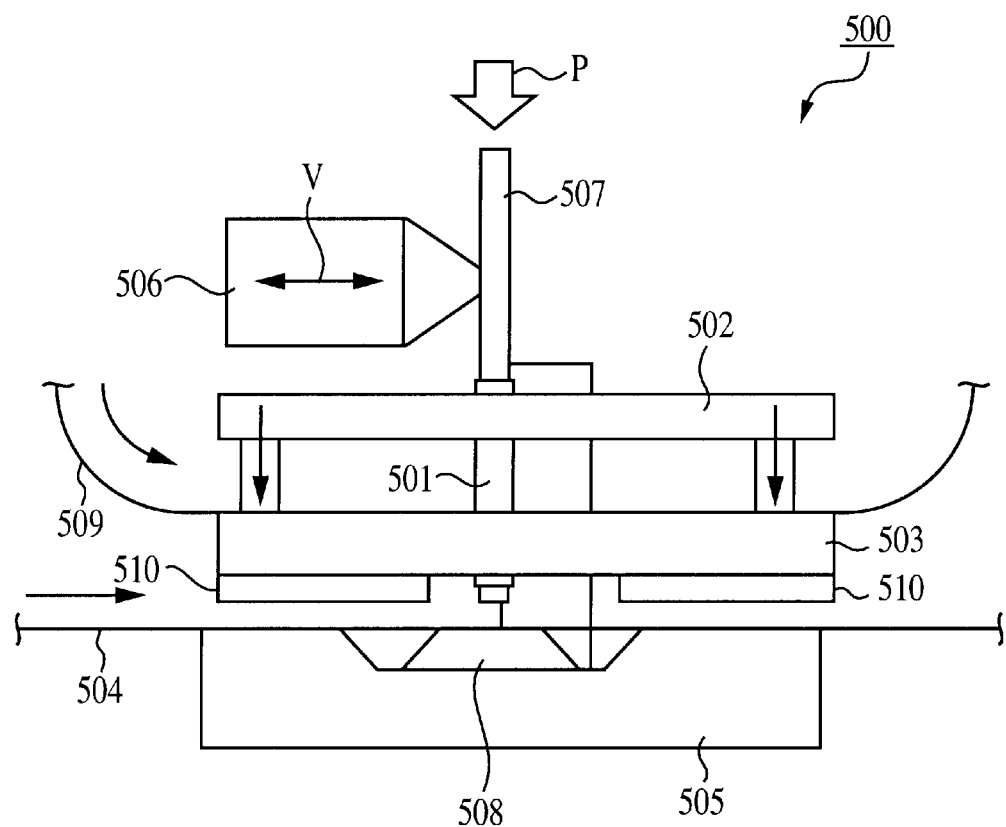
FIG. 10 is a mounting device for mounting an electronic component module employed in a manufacturing process according to the embodiments of this invention.

The device 500 is shown in FIG. 10 in detail, which includes a Thomson cutter 501 for punching out an electronic component module from a later-described module tape 509 worked into a hollow trunk shape, an upper mold 502 supporting the Thomson cutter 501, a stopper 503 serving as a lower die on cutting and a stopper pushing an antenna coil sheet (data carrier body) 504, a stationary block 505 supporting the antenna coil sheet from its bottom, a compression punch (punch) 507 passing through a hollow of the Thomson cutter 501 and connected with a horn 506 for applying an ultrasonic wave vibration V, and anvil 508 fixed to the stationary block 505 for catching and pressing the electronic component modules and the antenna coil sheet 504 with the compression punch 507 when an ultrasonic wave is loaded.

A process for ultrasonic-wave mounting an electronic module on a data carrier body by employing the device 500 will be described hereinafter.

(1) A module tape 509 continuously arranging the electronic component modules 420 (see FIGS. 6 and 9) on a carrier tape should be prepared, and passes through between the upper mold 502 and the stopper 503 to be cut out the electronic component module 420 into a predetermined shape by actuating the Thomson cutter after defining a position of the tape.

(2) The cut out electronic component module 420 is inserted into a hollow of the Thomson cuter 501, pushed out by a forward movement of the compression punch 507 to be positioned by the stopper 503, and pressed at a predetermined position of the fixed antenna coil sheet 504. If a soft member 510 such as rubber is disposed on a surface of the stopper 503, the module is firmly fixed without hurting a surface of the antenna coil sheet 504.

(3) Then, an ultrasonic wave vibration V is transferred to the join predetermined portions 6a-1, 414, 6a-2, and 415 (see FIG. 9) from the compression punch 507 by the horn 506 connected with the compression punch 507 to complete the ultrasonic wave junction construction of both members.

(4) Finally, the punch 507, the cutter 501 and the stopper 503 sequentially move up, thereby allowing the module tape 509 and the antenna coil sheet 504 to be released for movement.

(5) The above-mentioned sequential process is one process, the modules 420 are continually mounted on the antenna coil sheet 504 one by one, and the whole construction of the devices is shown in FIG. 11. The module tape 509 and the antenna coil sheet 504 are continuously formed in a role shape as shown in FIG. 11, and sent within the devices 500 by a predetermined pitch by a role feeders 600 to be worked.

Thus, according to this invention, joining of this kind of wiring boards is performed at a reduced cost and for a short time, and may be applied to the boards after mounting electronic components thereon.

What is claimed is:

1. A method for joining wiring boards, the method comprising:

providing first and second non-conductive wiring boards, both wiring boards being made up of a resin material, and both wiring boards being respectively covered with a conductive pattern; placing said first and second non-conductive wiring boards together in a face-to-face relationship such that a first predetermined portion of said conductive pattern covering said first wiring board is facing a second predetermined portion of said conductive pattern covering said second wiring board;

positioning the first and second predetermined portions between first and second welding surfaces of an ultrasonic welding tool;

applying an ultrasonic vibration to said first and second welding surfaces to weld the first and second predetermined portions of said respective conductive patterns, thereby creating a conductive bond therebetween;

exposing at least a portion of at least one of said first and second non-conductive wiring boards as a result of said act of applying an ultrasonic vibration; and welding at least a portion of said first non-conductive wiring board to said second non-conductive wiring board, thereby creating a mechanical bond between said wiring boards in addition to said conductive bond.

2. A method for manufacturing a data carrier, the method comprising:

providing an electronic component module being made up of a resin material and having a conductive pattern and at least one electronic component on at least one of its surfaces;

providing a data carrier body being made up of a resin material and having a spiral conductive pattern on its surface;

placing said electronic component module and said data carrier body together in a face-to-face relationship such that a first predetermined conductive portion of said electronic component module is facing a second predetermined conductive portion of said data carrier body;

positioning the first and second predetermined portions between first and second welding surfaces of an ultrasonic welding tool; and applying an ultrasonic vibration to said first and second welding surfaces to weld the first and second predetermined portions, thereby creating a conductive bond therebetween.

3. The method according to claim 2, further comprising:

exposing at least a portion of at least one of said electronic component module and said data carrier body as a result of said act of applying an ultrasonic vibration; and welding at least a portion of said electronic component module to said data carrier body, thereby creating a mechanical bond between said electronic component module and said data carrier body in addition to said conductive bond.

* * * * *